Jan. 26, 1965 N. R. CRAIN 3,167,662

HIGH-SPEED TRANSISTOR FLIP-FLOPS

Filed Feb. 2, 1962

INVENTOR.
NORMAN R. CRAIN
BY A. M. Fernandez
ATTORNEY

United States Patent Office 3,167,662
Patented Jan. 26, 1965

3,167,662
HIGH-SPEED TRANSISTOR FLIP-FLOPS
Norman R. Crain, Phoenix, Ariz., assignor to General Electric Company, a corporation of New York
Filed Feb. 2, 1962, Ser. No. 170,707
14 Claims. (Cl. 307—88.5)

Figures 1, 2:
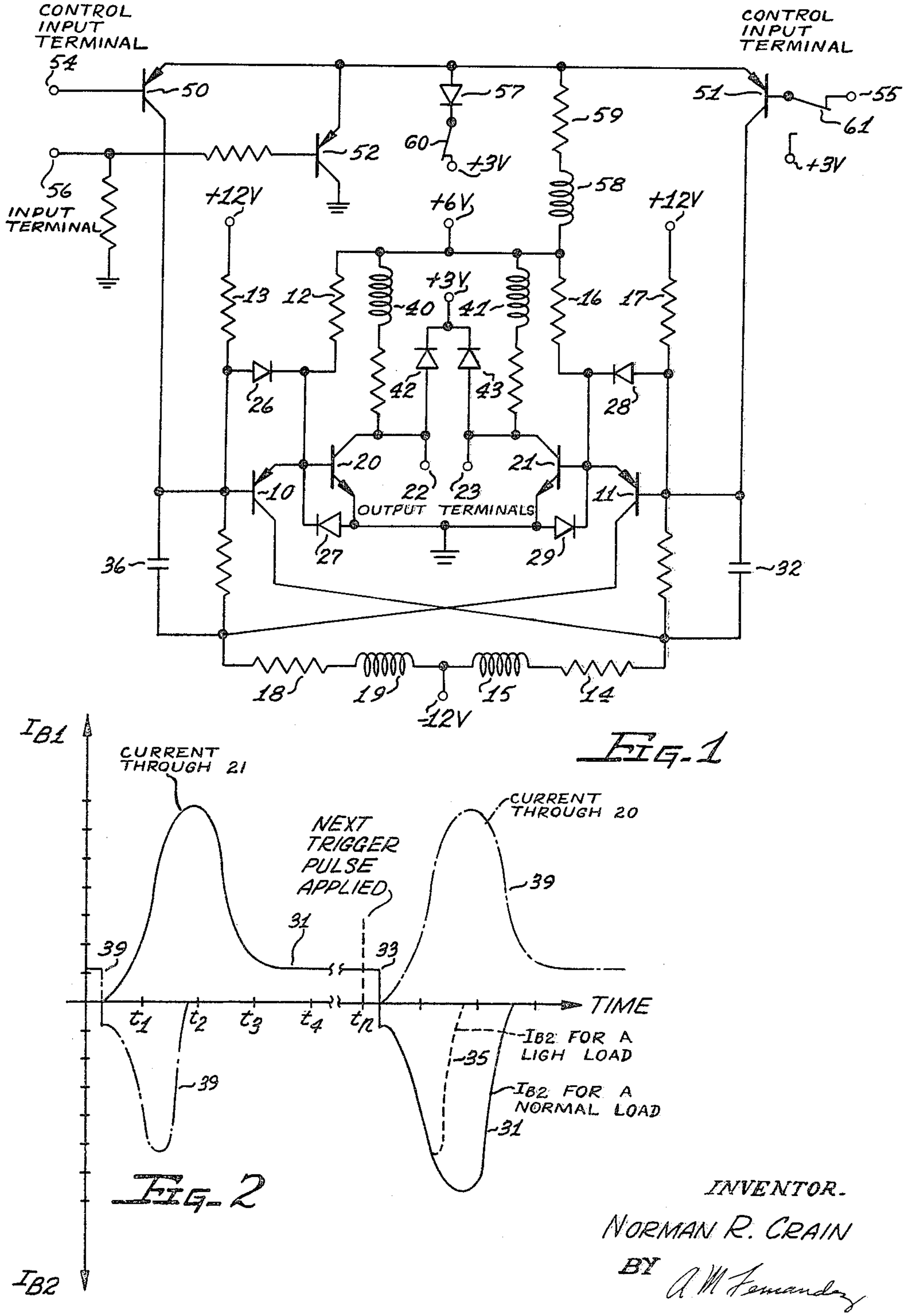

This invention pertains to high-speed transistor flip-flops and particularly to a high-speed transistor flip-flop having output amplifiers driven for fast saturated switching of heavy load currents while isolating the switching transistors from external noise and changes in load conditions.

The development of high speed epitaxial mesa transistors capable of fast switching of high collector currents of over one hundred milliamperes has made it possible to design transistor flip-flops for fast swtching of a relatively large current through a load. In order to isolate the switching transistors from external conditions, cascaded common-emitter transistor amplifiers have been employed in the past to couple the switching transistors to their respective loads. However, as the switching transistors are triggered to place the flip-flop in its alternate stable conditions, the conduction of each cascaded amplifier must also be switched, thereby retarding the overall switching action of the flip-flop.

A common emitter-coupling resistor may be provided to increase the regenerative feedback current to the cascaded amplifiers as the switching transistors are triggered to alternate states of conduction, thereby aiding the overall switching action. However, it restricts capacitive loads to slower switching rates because of the increased discharge time required to discharge load capacitance through the common emitter-coupling resistor. Such a coupling resistor has the additional disadvantage of consuming power.

A general object of the invention is to provide a means for aiding the switching action of a transistor flip-flop having cascaded, common-emitter transistor, output amplifiers.

A further object of the invention is to provide a transistor flip-flop with high switching rates for capactive loads.

Still another object is to provide an improved steering circuit for transistor flip-flops.

According to the present invention, two switching transistors of one conductivity type, cross-coupled to form a standard Eccles-Jordan flip-flop, are each emitter-follower connected to an output amplifier comprising a transistor of an opposite conductivity type. The emitter of each output transistor amplifier is directly connected to ground in order that low impedance discharge paths be presented to capacitive loads. A diode is connected between the base of each internal switching transistor and the base of its associated output transistor amplifier, and so poled as to be conductive when the internal switching transistor is being triggered from a particular stable conductive state to another and the associated output amplifier is thereby being driven from the other conductive state to the particular conductive state. The base-to-base coupling diode provides immediate current to drive the output amplifier to the particular conductive state.

An improved trigger steering circuit may be provided by two transistors, each having its collector connected to the base of a different switching transistor, and a third transistor connected in a common-emitter configuration to function as a trigger pulse amplifier. All steering circuit transistors are of the same conductivity type and have their emitters connected together. In operation, the trigger amplifier is normally conducting and the steering transistors are held non-conductive by steering control signals at one of two predetermined levels. When a trigger pulse of the proper polarity is applied to the trigger amplifier, it is driven to cutoff, and as it is driven to cutoff, its current is switched through the steering transistor being held cutoff by the steering control signal at the lower of the two predetermined levels, thereby providing a trigger signal to the flip-flop in accord with the control signal levels. The common emitter circuit prevents the other steering transistor from conducting.

Other objects and advantages of the present invention will be apparent from the following specification taken in conjunction with the accompanying drawing in which:

FIG. 1 is a circuit diagram of one embodiment of the invention utilizing a positive trigger pulse for switching it from one stable state to another; and FIG. 2 is a graphic representation of the waveforms of the base currents of the output amplifiers through two switching cycles in accordance with the present invention.

*High-speed flip-flop*

Referring now to FIG. 1, a conventional saturating flip-flop circuit is comprised of two PNP switching transistors 10 and 11. The transistor 10 is connected in a paraphase amplifier configuration having an emitter resistor 12 connected to +6 volts, a base-current biasing resistor 13 connected to +12 volts, and a collector impedance circuit, including a resistor 14 and an inductor 15, connected to −12 volts. Similarly the transistor 11 is connected as a paraphase amplifier having an emitter resistor 16, a biasing resistor 17 and a collector impedance circuit 18 and 19.

Two NPN transistors 20 and 21, each connected in a common-emitter configuration, are connected to the emitters of the transistors 10 and 11, respectively. They function as output amplifiers to drive load circuits which may be connected to output terminals 22 and 23.

As noted hereinbefore, the output amplifiers isolate the switching transistors 10 and 11 from external noise and changes in load conditions. The load in a digital computer or data processing system in which the present invention may be employed would normally be diodes of a number of logic gates, up to a predetermined maximum number. For example, the present invention may be built with selected components to typically produce a minimum output current of eighty milliamperes which may be employed to drive as many as twenty typical diode loads. Since the output transistors have their emitters connected directly to ground, the switching rates for capacitive loads is not effected.

The base currents of the transistors 20 and 21 have no appreciable effect on the switching transistors 10 and 11 due to the presence of diodes 26 to 29 in accordance with the present invention. They provide the requisite base currents for the output amplifier transistors 20 and 21 in a manner which may best be understood from the description of a switching cycle.

For the following description of a switching cycle, it is assumed that the transistors 10 and 21 are conducting and that the transistors 20 and 11 are cut off. Under those conditions, the base electrode of the transistor 20 is held at about −0.7 volt by the conduction of the diode 27 and the base electrode of the transistor 11 is held at about +1.6 volts by conduction through the diode 28. The base of the transistor 21 is held at about +0.9 volt by the forward base current $I_{b1}$ of the transistor 21 and partially by the bias resistor 17.

The forward base current $I_{b1}$ of the transistor 21 is sufficient to hold it at saturation and is represented by the level portion of the curve 31 in FIG. 2 from the time $t_4$ following a first switching cycle until a time $t_n$ when a positive trigger pulse is applied to the base of the transistor 10. The unit of time employed for the graph of FIG. 2 is one division of time for ten nanoseconds and the unit of current is one division for five milliamperes. A nanosecond is defined as $10^{-9}$ seconds or a millimicrosecond.

Following a very short delay of about three nanoseconds due to the saturation of the conducting transistor 10, the positive trigger pulse of current entering the base of the transistor 10 drives its collector from −1 volt toward −12 volts. The change in potential of the collector of the transistor 10 is instantaneously coupled to the base of the transistor 11 by a coupling capacitor 32 in the normal manner of an Eccles-Jordan type of flip-flop. The emitter-base, PN junction diode of the transistor 11 conducts immediately to draw reverse base current $I_{b2}$ from the transistor 21, thereby immediately driving it toward cutoff. The transition from forward base current $I_{b1}$ of the transistor 21 to reverse base current $I_{b2}$ occurs at point 33 of the curve 31 illustrated in FIG. 2.

As regeneration ensues in the normal manner of an Eccles-Jordan type of flip-flop, the transistor 11 draws its emitter current from the base of the transistor 21 until it is cut off and its stored charge is depleted. Thereafter, the transistor 11 draws its emitter current through the diode 29 and the resistor 16.

The maximum amplitude reached by the reverse base current $I_{b2}$ of the transistor 21 depends upon the load connected to the output terminal 23 as well as the intrinsic characteristics of the transistor 21 itself. For a light load, the reverse base current $I_{b2}$ may be as represented by the dotted curve 35. All of the excess collector current required by transistor 11 as it is driven to saturation is provided by the diode 29 and resistor 16 after all of the stored charge is depleted from the transistor 21.

On the other side of the flip-flop, the transistor 20 is switched from off to saturation. It is desirable that the switching action start taking place without the delay of first turning off the saturated transistor 10. That is accomplished in accordance with the present invention by the provision of the diode 26. As the transistor 11 is switched from off to on, its collector rises; that positive-going change in potential is coupled by a capacitor 36 not only to the base of the transistor 10 but also through the diode 26 to the base of transistor 20, thereby driving the transistor 20 to saturation while the transistor 10 is being driven fully out of conduction. The forward base current $I_{b1}$ for the transistor 20 is represented by the curve 39 of FIG. 2. It should be noted that the forward base current $I_{b1}$ of the transistor 20 immediately reverse biases the diode 27 and further that this current $I_{b1}$ basically comes from the opposite output transistor 21 in the form of $I_{b2}$ via the conducting transistor 11, the capacitor 36 and the diode 26.

After the switching action is complete and the forward base current $I_{b1}$ of the transistor 20 passes its maximum amplitude, a constant base current level is reached in the transistor 20 as illustrated by the horizontal portion of the curve 39. It should be noted that the portion of the curve 39 between the time $t_0$ and $t_2$ represents the reverse base current $I_{b2}$ of the transistor 20 during a previous switching cycle when the transistor 20 is switched from on to off and the transistor 11 is switched from off to on as represented by its base current curve 31.

The reverse base currents of the output transistors 20 and 21 may be unbalanced, as represented by the curves 39 and 31; the switching action just described is not affected by the amplitude of the reverse base currents because any excess emitter current required by the transistor 11 is provided by the diode 29. The diode 27 provides excess emitter current in a similar manner when the transistor 10 is switched from off to on. It should be noted that the diode 28 provides the major portion of the forward base current for the output transistor 21 to turn it on while the output transistor 20 is turned off and the switching transistor 10 is turned on.

As the flip-flop is switched from one stable state to another by positive trigger pulses, which may be as short in duration as 2.5 nanoseconds and at a repetition rate as high as twenty-five megacycles per second, the capacitances of the loads should be charged and discharged as rapidly as possible. As noted hereinbefore, the common-emitter configuration of each output amplifier provides a very low impedance path for the discharge of load capacitance when conducting. The fast switching rate of the output transistors 20 and 21 is made possible in accordance with the present invention by the provision of the diodes 26 and 29, and 27 and 28, without resorting to the provision of an emitter-coupling resistor for regenerative feedback between the output amplifiers.

Coils 40 and 41 are provided in the emitter circuit of the respective output transistors 20 and 21 in order to provide current to recharge the capacitive loads when the output amplifiers are turned off. For example, when the transistor 20 is cut off, the current stored in the coil 40 continues to flow through the load capacitance effectively connected between the output terminal 22 and ground until it is charged to +3 volts. The level to which the load capacitances are charged is determined by clamping diodes 42 and 43 which are connected to +3 volts in FIG. 1 for purposes of illustration.

*Improved steering circuit*

An improved steering circuit is provided for the flip-flop of FIG. 1 in order to advantageously utilize its high-speed switching capabilities. That is accomplished by a current switching circuit of novel construction comprising a pair of steering transistors 50 and 51 and a pulse amplifying transistor 52. Two input terminals 54 and 55 of the steering circuit are normally held at +4.5 volts by control circuits not shown. A third input terminal 56 is normally held at +1 volt. Under those conditions the transistor 52 is conducting and its emitter circuit is at about +0.7 volt, thereby holding the transistors 50 and 51 cut off.

In operation, the control input terminals 54 and 55 may be at either +2 volts or +4.5 volts to set or reset the flip-flop in accord with the following table.

| Terminals 54 | Terminals 55 | Switching Action |
|---|---|---|
| +4.5 | +4.5 | None. |
| +4.5 | +2 | Reset. |
| +2 | +4.5 | Set. |

The combination of +2 volts at both control terminals 54 and 55 is prohibited for reasons which will become apparent from the following description.

With both control terminals 54 and 55 at +4.5 volts, no switching action occurs upon the application of a positive trigger pulse to the terminal 56 because, as the trigger pulse is applied, the transistor 52 is driven toward cutoff until its emitter potential rises to about +3 volts. Thereafter, the transistor is actually cut off as the trigger pulse increases beyond +3 volts to about +4.5 volts, but neither of the transistors 50 and 51 is rendered conductive because of the reverse base-to-emitter bias present when their emitters are clamped at +3 volts by a diode 57 and their bases held at +4.5 volts. After the trigger pulse passes, the transistor 52 is returned to conduction. Thus, under the first condition of the foregoing table, no switching action occurs. In a digital computer or data processing system, that condition may arbitrarily be defined as a binary digit 0 being applied to both control terminals 54 and 55.

Considering next the second condition of the foregoing table which may be defined as the application of binary digits 0 and 1 to the respective terminals 54 and 55; when a trigger pulse is applied to the terminal 56, the transistor 52 is again cut off, but before its emitter is allowed to rise to +3 volts, the transistor 51 conducts since its base is held at +2 volts. As the transistor 52 is cut off and the transistor 51 is turned on, the current through the transistor 52 from a source of +6 volts through an inductor 58 and a resistor 59 is switched to the base of the transistor 11, thereby turning it off and turning on the transistor 10. In that manner, the flip-flop is synchronously switched to a stable state arbitrarily defined as the reset state when a binary digit 1 is present at the input terminal 55.

The third condition of the foregoing table produces an opposite switching action because it allows the transistor 50 to conduct when the transistor 52 is cut off, thereby switching current to the base of the transistor 10 to turn it off and turn on the transistor 11. That opposite switching action produces the alternate stable state defined as the set state.

The condition of a +2 volt signal at both control terminals 54 and 55 is prohibited because it would tend to cause both transistors 50 and 51 to conduct upon the occurrence of a positive trigger signal at the terminal 56 and the switching action produced thereby would be unpredictable.

In many applications it is desirable to provide a steering circuit for setting or resetting a flip-flop upon the application of a trigger pulse in accord with the presence of a binary digit 1 or 0 signal at a single control terminal. That may be accomplished with the present improved steering circuit by connecting one control terminal to a source of +3 volts and disconnecting the diode 57, as by proper positioning of switches 60 and 61. Under those conditions, the transistor 51 will conduct to reset the flip-flop, upon the application of a trigger pulse, only when a binary digit 0 signal of +4.5 volts is present at the input terminal 54. When a binary digit signal of +2 volts is present at the input terminal 54, the transistor 50 conducts and the flip-flop is set.

It should be noted that the output signals provided by the flip-flop at the output terminals 22 and 23 are 0 and +3 volts. Either signal level may be arbitrarily defined as representing a binary digit 1. For instance, if a +2 volt signal at the input terminal 54 is defined as a binary digit 1, the flip-flop must store a binary digit 1 by being switched to the stable state of the transistor 20 conducting and the transistor 21 non-conducting. The opposite stable state is then employed to store a binary digit 0. If voltage level of 0 volt is selected to represent a binary digit 1 at the output of the flip-flop, the level of +3 volts must represent a binary digit 0 and the output terminal 22 identified as the "true" or "1" output terminal; the other terminal 23 is then identified as the "false" or "0" output terminal, frequently referred to as the "complementary" output terminal.

In a digital system utilizing the present invention, inverting amplifiers may be employed in the logic circuits to translate the output signals of flip-flops to the input signals required by the steering circuits.

While the principles of the invention have now been made clear in an illustrative embodiment, there will be immediately obvious to those skilled in the art many modifications in structure, arrangement, proportions, the elements, materials and components, used in the practice of the invention, and otherwise, which are particularly adapted for specific environments and operating requirements, without departing from those principles. The appended claims are therefore intended to cover and embrace any such modifications, within the limits only of the true spirit and scope of the invention. For instance, all transistors may be of the same conductivity type. If the PNP type is selected, both transistors on a given side would be switched on and off together and the diode coupling the bases together, such as the diode 26, would perform the same function of allowing the output amplifier to be switched without the delay of first switching its associated flip-flop switching transistor. If the output amplifier transistors 20 and 21 are selected to be of the PNP type, the connections to the diodes 27 and 29 should be reversed, and if the flip-flop switching transistors 10 and 11 are selected to be of the NPN type, the connections to the diodes 26 and 28 should be reversed.

What is claimed is:

1. A flip-flop comprising: a first and second transistor, each having a base, emitter and collector; means for cross-coupling said first and second transistors to form a bistable switch; a third transistor having a base, emitter and collector and being connected in a common-emitter configuration; means for coupling the base of said third transistor to the emitter of said second transistor; and a first unidirectional conducting means coupling the base of said second transistor to the base of said third transistor.

2. A flip-flop as defined in claim 1 further comprising a second unidirectional conducting means coupling the emitter of said first transistor to ground, both said first and second unidirectional conducting means being so polarized as to provide a direct-current path for base current to switch the conductivity state of said third transistor as the conductivity state of said first and second transistors is switched from one stable condition to another.

3. A flip-flop comprising: a first pair of transistors, each having a base, emitter and collector, cross-coupled to form a bistable switch; a second pair of transistors, each having a base, emitter and collector, connected in a common-emitter configuration; means for emitter-follower coupling the base of each of said second pair of transistors to the emitter of a different one of said first pair of transistors; and a pair of unidirectional conducting means, each unidirectional conducting means coupling the base of a different one of said second pair of transistors to the base of the one of said first pair of transistors to which said different one of said second pair of transistors is emitter-follower coupled.

4. A flip-flop as defined in claim 3 further comprising a second pair of unidirectional conducting means, each unidirectional conducting means of said second pair coupling the emitter of a different transistor of said first pair of transistors to ground, both of said first and second pairs of unidirectional conducting means being so polarized as to provide first and second direct-current paths for base current to alternately switch the conductivity state of said second pair of transistors as said first pair of transistors is switched from one stable condition to another.

5. A flip-flop comprising: a first pair of transistors of one conductivity type, each having a base, emitter and collector, cross-coupled to form a bistable switch; a second pair of transistors of a conductivity type opposite said first pair of transistors, each transistor of said second pair having a base, emitter and collector and being connected in a common-emitter configuration for providing current to load circuits; means for emitter-follower coupling the base of each of said second pair of transistors opposite to the emitter of a different one of said first pair of transistors, a first pair of unidirectional conducting means, each connected between the base of a different transistor of said first pair and the transistor having its base connected to the emitter of the transistor of said first pair and so poled as to provide a direct-current path for forward-base current to switch the conductivity state of the transistor of said second pair to which said unidirectional conducting means is connected as the conductivity state of said first pair of transistors is switched from one stable condition to another.

6. A flip-flop as defined in claim 5 further comprising a second pair of unidirectional conducting means, each unidirectional conducting means of said second pair coupling the emitter of a different transistor of said first pair of transistors to ground, said second pair of unidirectional conducting means being so polarized as to provide first and second direct-current paths for excess forward-base currents to alternately switch the conductivity state of said second pair of transistors as said first pair of transistors is switched from one stable condition to another.

7. A flip-flop comprising: a pair of transistors of a first conductivity type, each having a base, emitter and collector, each transistor being connected in a paraphase-amplifier configuration and said pair of transistors being cross-coupled to form a bistable switch; a pair of transistors of a second conductivity type, each having a base, emitter and collector, said pair of transistors being connected in a common-emitter configuration; means for emitter-follower coupling the base of each of said pair of transistors of said second conductivity type to the emitter of a different one of said pair of transistors of said first conductivity type; and a pair of diodes, each being connected between the base of a transistor of said first conductivity type and the base of a transistor of said second conductivity type the base of which is emitter-follower coupled to the transistor of said first conductivity type, said diode being poled to conduct forward-base current from the base of the transistor of said first conductivity type to which said diode is connected and the base of the transistor of said second conductivity type to which said diode is connected.

8. A flip-flop as defined in claim 7 further comprising a second pair of diodes, each diode coupling the emitter of a different transistor of said first conductivity type to ground and being polarized to provide current for the emitter of the transistor of said first conductivity type to which connected.

9. A flip-flop comprising: a first pair of transistors, each having a base, an emitter and a collector, said collector being connected through respective load impedances to a source of potential of a first polarity, said bases being connected through respective resistors to a source of bias potential of a second polarity, said emitters being connected to a source of potential of said second polarity intermediate said bias potential and a reference potential, and the collector of each transistor being connected to the base of the other transistor through a corresponding impedance means whereby the other transistor is rendered nonconductive when either transistor is conducting; a second pair of transistors, each having a base, an emitter and a collector, said collectors being connected through respective load impedances to a source of potential, said emitters being connected to said source of reference potential, and the base of each transistor being connected to the emitter of a different one of said transistors of said first pair whereby the conductivity of each transistor of said second pair is controlled by the conductivity of the transistor to which connected; and a pair of diodes, each diode being connected between the base of a transistor of said first pair and the base of the transistor of said second pair to which the transistor of said first pair is connected, each of said diodes being polarized to provide direct current to the base of the transistor of said second pair to which said diode is connected simultaneously with the provision of base current to the base of the transistor of said first pair to which said diode is connected during a switching cycle, thereby initiating the transition of conductivity of the transistor of said second pair simultaneously with the initiation of the transition of conductivity of the transistor of said first pair to which said diode is connected.

10. A flip-flop as defined in claim 9 further comprising a second pair of diodes, each diode being connected between the emitter of a different transistor of said first pair and a point at said reference potential.

11. A steering circuit for a flip-flop having a first input terminal for switching to one stable condition and a second input terminal for switching to a second stable condition in response to trigger signals of a given polarity, said steering circuit comprising: first, second and third transistors of a common conductivity type, each having an emitter, collector and base electrode; impedance means for coupling the emitters of said first, second and third transistors to a first source of potential of a given polarity; a reference potential, means for clamping the emitters of said first, second and third transistors to a potential between the potential of said first source of potential and said reference potential; means for connecting the collector of said first transistor to said reference potential; means for connecting the collector electrodes of said second and third transistors to the respective first and second input terminals of said flip-flop; means for coupling the base of said first transistor to a source of bias potential of such polarity and magnitude as to render said first transistor normally conductive; means for coupling the base of said first transistor to a source of said trigger signals whereby said first transistor is rendered nonconductive in response thereto; means for coupling the base of said second and third transistors to sources of complementary steering signals of two amplitudes, one steering signal being of greater amplitude than the other but both being of an amplitude between the amplitude of said bias potential coupled to the base of said transistor and the amplitude of said trigger signals, whereby upon said first transistor being rendered nonconductive in response to a given trigger signal, the particular one of said second and third transistors receiving a steering signal of the lowest amplitude is rendered conductive in response to which a current signal is switched from said first transistor through the particular one of said second and third transistors to the corresponding input terminal of said flip-flop to which said particular one of said second and third transistors is connected.

12. A steering circuit for a flip-flop having a first input terminal for switching to one stable condition and a second input terminal for switching to a second stable condition in response to trigger signals of a given polarity, said steering circuit comprising: first, second and third transistors of a common conductivity type, each having an emitter, collector and base electrode, impedance means for coupling the emitters of said first, second and third transistors to a first source of potential of a given polarity; means for connecting the collector of said first transistor to a point of reference potential; means for connecting the collector of said second and third transistors to the respective first and second input terminals of said flip-flop; means for coupling the base of said first transistor to a source of bias potential of such polarity and magnitude as to render said first transistor normally conductive; means for coupling the base of said first transistor to a source of said trigger signal whereby said first transistor is rendered nonconductive in response thereto; means coupling the base of said second transistor to a potential between the potential of said first source of potential and said reference potential; and means for coupling the base of said third transistor to a source of logic-control signals of two logic levels, one level being a potential between said reference potential and the potential coupled to the base of said second transistor and said second level being between the potential coupled to the base of said second transistor and the potential of said first source of potential, whereby upon said first transistor being rendered nonconductive in response to a given trigger signal, the particular one of said second and third transistors having its base coupled to the lowest potential at the time the trigger signal is received is rendered conductive in responsive to which a current signal is switched from said first transistor through the particular one of said second and third transistors to the corresponding input terminal of said flip-flop to which said particular one of said second and third transistors is connected.

13. A flip-flop comprising: first and second transistors each having a base, emitter and collector; means for cross-coupling said first and second transistors to form a bistable switch; a third transistor having base, emitter and collector connected in a common-emitter configuration; means for coupling the base of said third transistor to the emitter of said second transistor; a first unidirectional conducting means coupling the base of said second transistor to the base of said third transistor; fourth and fifth switching transistors each having an input terminal connected to a separate source of steering signals, and a sixth transistor having an input terminal connected to a source of trigger signals, the output terminal of each of said switching transistors being connected to the base of a different one of said first and second transistors, the output terminal of said sixth transistor being connected to each of said switching transistors.

14. A flip-flop comprising: a first pair of transistors each having a base, emitter and collector cross-coupled to form a bistable switch; a second pair of transistors each having a base, emitter and collector connected in a common-emitter configuration; means for coupling the base of each of said second pair of transistors to the emitter of a different one of said first pair of transistors; a first pair of unidirectional conducting means each coupling the base of a different one of said second pair of transistors to the base of one of said first pair of transistors to which said different one of said second pair of transistors is emitter-follower coupled; a second pair of unidirectional conducting means, each of said unidirectional means of said second pair coupling the emitter of a different transistor of said first pair of transistors to ground, both of said first and second pairs of unidirectional conducting means being so polarized as to provide first and second direct-current paths for base current to alternately switch the conductive state of said second pair of transistors as said first pair of transistors is switching from one stable condition to another; a third pair of transistors each having a base, emitter and collector; each of said third pair of transistors having its base connected to a separate source of steering signals; and a seventh transistor having a base, emitter and collector with the base connected to a source of trigger signals; the output of each transistor of said third pair being connected to the base of a different one of said first pair of transistors; the output of said seventh transistor being connected to the emitter of each of said third pair of transistors.

References Cited by the Examiner

UNITED STATES PATENTS 2,921,192 1/60 Casey et al. ----------- 328—206

FOREIGN PATENTS 881,127 11/61 Great Britain.

JOHN W. HUCKERT, *Primary Examiner.*

GEORGE N. WESTBY, *Examiner.*